(12) United States Patent
Matsui (10) Patent No.: US 8,139,372 B2
(45) Date of Patent: Mar. 20, 2012

(54) PRINTED CIRCUIT BOARD, METHOD FOR MANUFACTURING PRINTED CIRCUIT BOARD AND ELECTRONIC APPARATUS

(75) Inventor: Yuusuke Matsui, Nakata-gun (JP)

(73) Assignee: DENSO CORPORATION, Kariya (JP)

( * ) Notice: Subject to any disclaimer, the term of this patent is extended or adjusted under 35 U.S.C. 154(b) by 630 days.

(21) Appl. No.: 12/285,352

(22) Filed: Oct. 2, 2008

(65) Prior Publication Data

US 2009/0086450 A1    Apr. 2, 2009

(30) Foreign Application Priority Data

Oct. 2, 2007 (JP) ................................. 2007-258823

(51) Int. Cl.
*H05K 1/14* (2006.01)
*H05K 7/18* (2006.01)

(52) U.S. Cl. ......... 361/799; 361/794; 174/250; 174/252
(58) Field of Classification Search .................. 361/794, 361/799; 174/250, 252
See application file for complete search history.

(56) References Cited

U.S. PATENT DOCUMENTS

| 7,036,214 B2 | 5/2006 | Kondo et al. |
| 7,491,899 B2 * | 2/2009 | Zuehlsdorf et al. ............ 174/372 |
| 2008/0168651 A1 * | 7/2008 | Bhatt et al. ..................... 29/830 |

FOREIGN PATENT DOCUMENTS

| JP | A-5-315790 | 11/1993 |
| JP | A-11-054939 | 2/1999 |
| JP | A-2000-312078 | 11/2000 |
| JP | A-2001-111237 | 4/2001 |

OTHER PUBLICATIONS

Office Action mailed Sep. 27, 2011 in corresponding JP application No. 2007-258823 (and English translation).

* cited by examiner

*Primary Examiner* — Yuriy Semenenko
*Assistant Examiner* — Andargie M Aychillhum
(74) *Attorney, Agent, or Firm* — Posz Law Group, PLC (57) ABSTRACT

A printed circuit board is disclosed. The printed circuit board includes an insulation layer and a conductor layer having a GND pattern. The printed circuit board has a center portion, to which an element is to be mounted. The printed circuit board has a periphery portion and a slit pattern separating the periphery portion from the center portion. The GND pattern extends through the center portion and the periphery portion.

1 Claim, 7 Drawing Sheets

PRINTED CIRCUIT BOARD, METHOD FOR MANUFACTURING PRINTED CIRCUIT BOARD AND ELECTRONIC APPARATUS

CROSS REFERENCE TO RELATED APPLICATIONS

The present application is based on Japanese Patent Application No. 2007-258823 filed on Oct. 2, 2007, the disclosure of which is incorporated herein by reference.

BACKGROUND OF THE INVENTION

1. Field of the Invention

The present invention relates to a printed circuit board, a method of manufacturing a printed circuit board, and an electronic apparatus.

2. Description of Related Art

Since techniques of multilayer printed circuit board and mounting a component have been developed, it becomes possible to downsize a printed circuit board (cf. Japanese Unexamined Patent Application Publication Number 2003-264369, corresponding to U.S. Pat. No. 7,036,214). The downsizing of the printed circuit board, however, makes it difficult to provide a sufficient ground (GND) area to a printed circuit board for a large current circuit, which is for example a board for a switching-mode power supply. In such a case, it is difficult to flow a return current sufficiently. As a result, there arises a difficulty associated with aggravating electromagnetic compatibility (EMC). One method for addressing the above difficulties is that a GND pattern of a printed circuit board is connected to, for example, a metal body by using an on-board connection to provide a sufficient GND area.

In the above method, however, it is necessary to increase screw holes placed on the printed circuit board, and it is necessary to place a spring or an on-board contact on the printed circuit board. Thus the above manner reverses the downsizing of the printed circuit board, and in addition, leads to an increase in manufacturing cost.

SUMMARY OF THE INVENTION

In view of the above described and other difficulties, it is an objective of the present invention to provide a printed circuit board, a method of manufacturing a printed circuit board, and an electronic apparatus.

According to a first aspect of the present invention, a printed circuit board is provided. The printed circuit board includes an insulation layer and a conductor layer having a GND pattern. The GND pattern extends outward more than a perimeter of the insulation layer.

According to the above printed circuit board, it is possible to enhance a GND without increasing a manufacturing cost and a size of the printed circuit board.

According to a second aspect of the present invention, a printed circuit board is provided. The printed circuit board includes an insulation layer and a conductor layer having a GND pattern. The printed circuit board has a center portion, to which an element is to be mounted. The printed circuit board further has a periphery portion and a slit pattern portioning the periphery portion and the center portion. The GND pattern extends through the center portion and the periphery portion.

According to the above printed circuit board, it is possible to enhance a GND without increasing a manufacturing cost and a size of the printed circuit board.

According to a third aspect of the present invention, a method for manufacturing a printed circuit board is provided. The printed circuit board includes an insulation layer and a conductor layer having a GND pattern. The GND pattern extends outward more than a perimeter of the insulation layer. The method for manufacturing the printed circuit board includes preparing a substrate. The substrate includes an insulation layer and a conductor layer having a GND pattern. The substrate has a center portion, a periphery portion and a slit pattern partitioning the periphery portion and the center portion. The GND pattern extends through the center portion and the periphery portion. The method for manufacturing the printed circuit board further includes removing the periphery portion from the substrate while remaining a portion of the GND pattern, the portion located in the periphery portion.

According to the above method, it is possible provide a printed circuit board having an enhanced GND without increasing a manufacturing cost and a size of the printed circuit board.

According to a third aspect of the present invention, an electronic apparatus is provided. The electronic apparatus includes a printed circuit board. The printed circuit board includes an insulation layer and a conductor layer having a GND pattern. The GND pattern extends outward more than a perimeter of the insulation layer. The electronic apparatus further has at least one of a case accommodating the printed circuit board and a frame. The at least one of the case and the frame has an electrical conductivity. The at least one of the case and the frame is in contact with the GND pattern.

According to the above electronic apparatus, it is possible to insure a GND area when the printed circuit board is minimized. It is possible to restrict an increase in a manufacturing cost and a size of the printed circuit board.

According to a fourth aspect of the present invention, a multilayer rigid flexible circuit board is provided that includes multiple insulation layers and multiple conductor layers. The multiple insulation layers and the multiple conductor layers are alternately laminated. At least one of the multiple conductor layers has a GND pattern that extends outward more than a perimeter of each insulation layer. At least one of the multiple insulation layers has a conductive paste and a via hole filled with the conductive paste. The conductive paste electrically connects between two of the multiple conductor layers that sandwiches the at least one of the insulation layers.

According to the above multilayer rigid flexible printed circuit board, it is possible to enhance a GND without increasing a manufacturing cost and a size of the printed circuit board.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE EXEMPLARY EMBODIMENTS

Exemplary embodiments according to the present invention are described below with reference to the drawings.

A method for manufacturing a rigid flexible printed circuit board as a printed circuit board is described below with reference to FIGS. 1 to 8.

A method for manufacturing a single-sided conductor pattern film is described below. A single-sided conductor pattern film 3 in FIG. 1A has a conductor pattern 7 (i.e., conductor layer 7) formed in such a manner that a conductive foil pasted on a resin film 5 (i.e., insulation layer) is patterned by etching. In the present embodiment, the conductive foil has a thickness of, for example, 18 μm. The resin film 5 includes a thermoplastic resin composed of a polyether ether ketone resin of 65% to 35% by weight and a polyetherimide resin of 35% to 65% by weight.

Figure 1A:
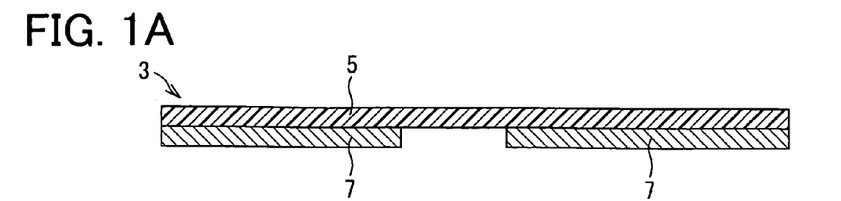
FIGS. 1A to 1F are cross sectional diagrams each schematically illustrating a process in a method for manufacturing a single-sided conductor pattern film.
Figure 1B:
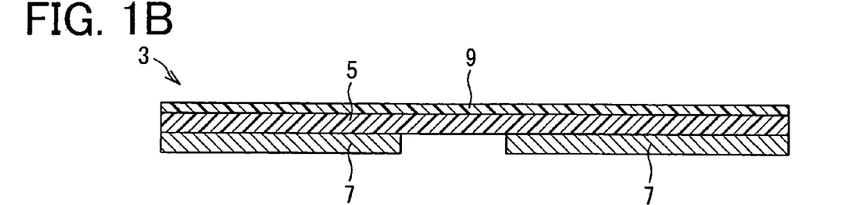

After completion of the formation of the conductor pattern 7 as shown in FIG. 1A, a protection film 9 is pasted on the single-sided conductor pattern film 3 by using, for example, laminating machine so that the protection film 9 is located opposite to the conductor pattern 7 with respect to the resin film 5, as shown in FIG. 1B. The protection film 9 includes a resin layer and an adhesive layer. The resin layer on a bonding plane side is coated with the adhesive layer. The adhesive layer includes an ultraviolet [UV] curable adhesive agent whose major composition is acrylate resin. When the adhesive layer is irradiated with ultraviolet, a cross-liking reaction proceeds, and an adhesive power of the adhesive layer decreases.

Figure 1C:
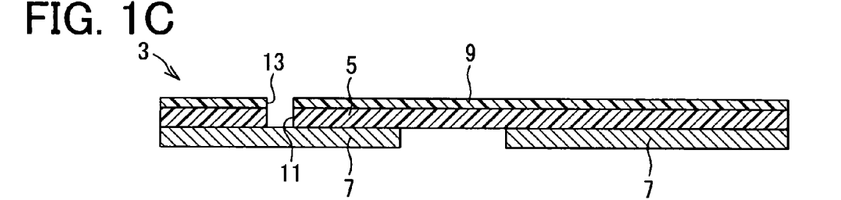

After completion of the pasting of the protection film 9 as shown in FIG. 1B, the film 3 is irradiated with carbon dioxide gas laser from a protection film 9 side, so that a via hole 11 is formed on the resin film 5, as shown in FIG. 1C. The via hole 11 has a bottom defined by the conductor pattern 7. In forming the via hole 11, the carbon dioxide gas laser is controlled in respect of an output power, an irradiation time or the like so that the conductor pattern 7 does not open. In the above case, as shown in FIG. 1C, an opening 13 having a diameter approximately equal to the via hole 11 is formed on the protection film 9 also. In forming the via hole 11, it is possible to use excimer laser or the like instead of the carbon dioxide gas laser. Alternatively, the via hole 11 may be formed by drill or the like. However, the use of laser beam may enable formation of a microscopic hole, and further, may cause the conductor pattern 7 to be less damaged.

Figure 1D:
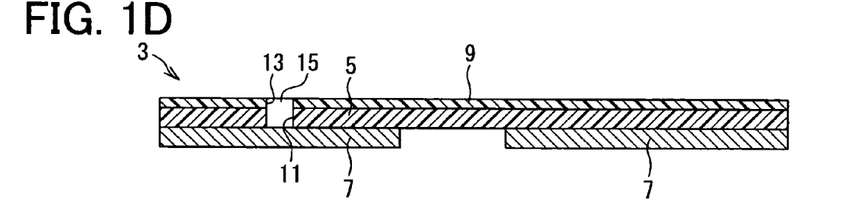

After completion of the formation of the via hole 11 as shown in FIG. 1C, the via hole 11 is filled with a conductive paste 15, as shown in FIG. 1D. The conductive paste 15 functions as an interlayer connection material. The conductive paste 15 is prepared, for example, in the following manners. Tin (Sn) particles having a mean particle size of 5 micron meter and a specific surface area of 0.5 m²/g are prepared. Silver (Ag) particles having a mean particle size of 1 μm and a specific surface area of 1.2 m²/g are prepared. The tin (Sn) particles of a total mass of 300 g and the silver (Ag) particles of a total mass of 300 g are added into terpineol, which is organic solvent, of a mass of 60 g. The terpineol receiving the tin and silver particles is kneaded by using a mixer so as to be paste form.

The conductive paste 15 is printed from the opening 13 side of the protection film 9 and fills in the via hole 11 by using a screen printer. In the present embodiment, the screen printer is used for filling the conductive paste 15 in the via hole 11. Alternatively, another method or another apparatus, which is for example a dispenser, may be used for filling the conductive paste 15.

Figure 1E:
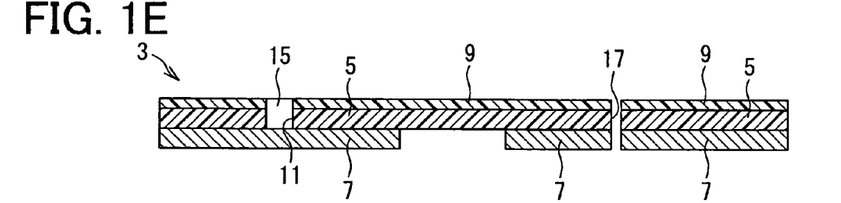
Figure 2:
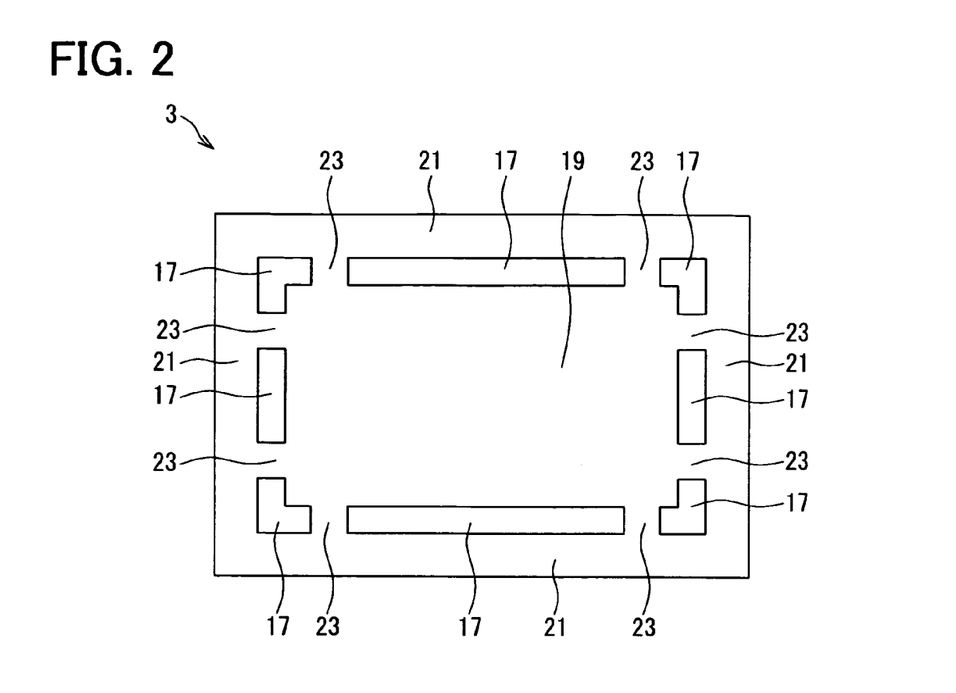
FIG. 2 is a plan view illustrating a single-sided conductor pattern film.

After completion of the filling of the conductive paste 15 in the via hole 11, a slit 17 is formed by cutting off parts of the resin film and parts of the conductive pattern 7 at a desired location, as shown in FIG. 1E. As shown in FIG. 2, the slit 17 partitions a center portion 19 of the single-sided conductor pattern film 3a and a periphery portion 21 of the single-sided conductor pattern film 3a. The periphery portion 21 surrounds the center portion 19. It should be noted that the center portion 19 and the periphery portion 21 are partially connected to each other via parts of a perforation portion 23, the parts where the slit 17 is not formed. The slit 17 is formed in such a manner that the resin film 5 is irradiated with laser. Alternatively, the slit 17 may be formed by a drill router, a punching process, or the like. The center portion 19 corresponds to a place where elements are to be mounted. The periphery portion 21 corresponds to so called an ear (stamped part) used for, for example, carrying a populated board.

A width of the slit 17 is less than or equal to, for example, 1 mm, and may be less than or equal to a thickness of the resin film 5. As described below, a heat and a pressure are applied to the resin film 5 in a state where multiple layers are laminated. In applying the heat and the pressure, thermoplastic resin composing the resin film 5 is softened and fluidized. In such a case, when the width of the slit 17 is large, the thermoplastic resin flows so as to close the slit 17, and hence, flow amount of the thermoplastic resin tends to be large. In the above case, since the conductor pattern 7 formed on the resin film 5 may possibly displace from a correct position, it may be preferable that the width of the slit 17 is small.

After completion of the forming of the slit 17, an ultraviolet is irradiated from a protection film 9 side by using an ultraviolet lamp. Thereby, the adhesive layer of the protection film 9 is hardened, and the adhesive power of the adhesive layer decreases.

Figure 1F:
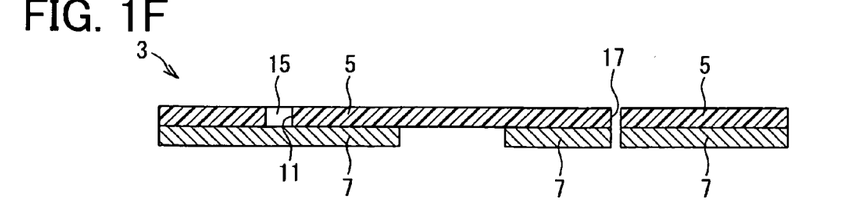

After completion of the irradiating of the protection film 9 with ultraviolet, the protection film 9 is peeled off and removed from the single-sided conductor pattern film 3. As shown in FIG. 1F, there is provided the single-sided conductor pattern film 3 in which the slit 17 is formed at the desired position on the resin film 5, and in which the via hole 11 is filled with the conductive paste 15.

Figure 3:
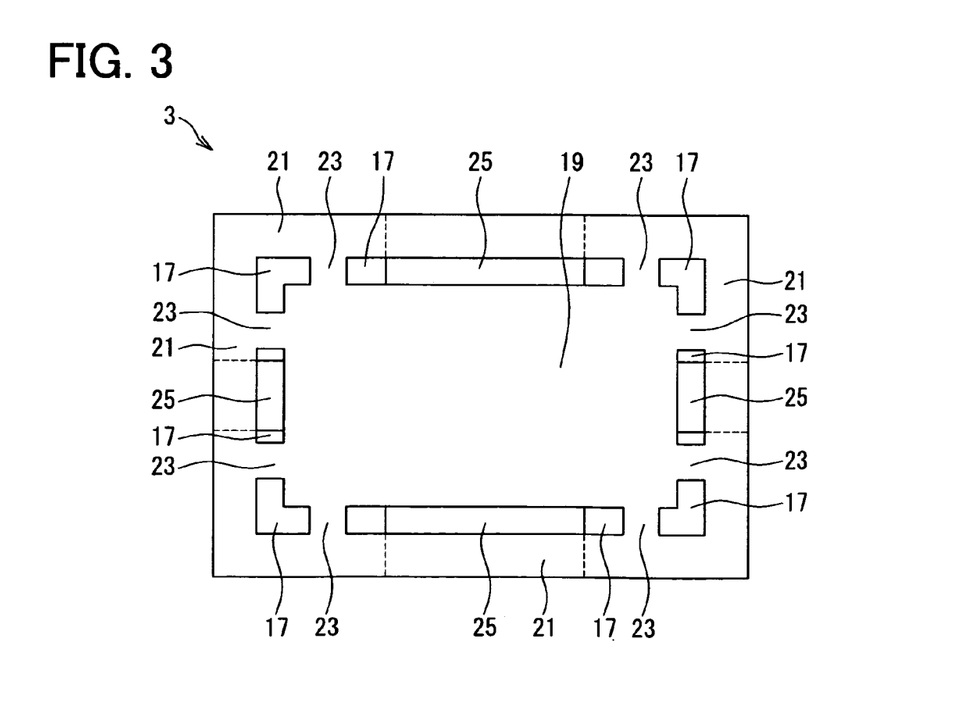
FIG. 3 is a plan view illustrating a single-sided conductor pattern film.
Figure 4:
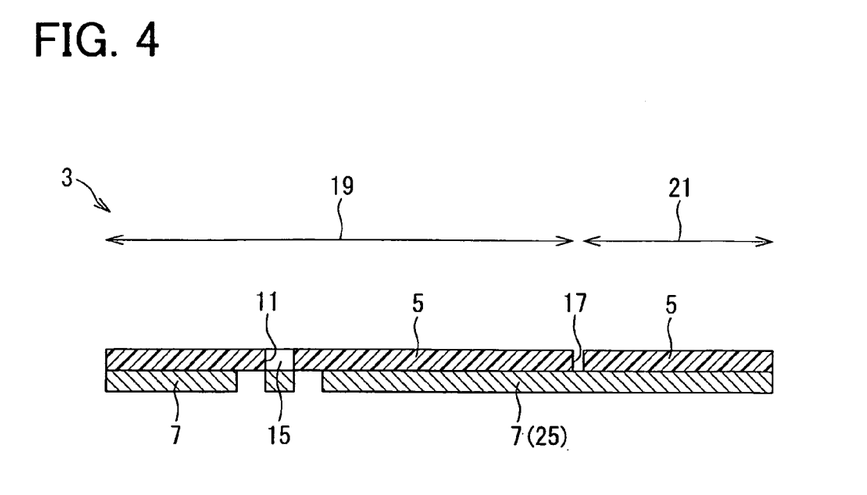
FIG. 4 is a cross sectional diagram illustrating a single-sided conductor pattern film.

Through the above manufacturing method, multiple single-sided conductor pattern films 3 are manufactured. Although one of the multiple single-sided conductor pattern films has a configuration generally similar to the single-sided conductor pattern film 3, the one of the multiple single-sided conductor pattern films has the following configuration as shown in FIG. 3 and FIG. 4. A GND pattern 25, which is a portion of the conductor pattern 7, extends from the center portion 19 to an end portion of the periphery portion 21. At a portion corresponding to the slit 17, the resin film 5 is cut but the GND pattern 25 remains. In the followings, the single-sided conductor pattern film 3 in which the GND pattern 25 remains at the portion corresponding to the slit 17 is referred to as the single-sided conductor pattern film 3a. The single-sided conductor pattern film 3 in which both of the resin film 5 and the GND pattern 25 are cut at the portion corresponding to the slit 17 is referred to as the single-sided conductor pattern film 3b.

Figure 5:
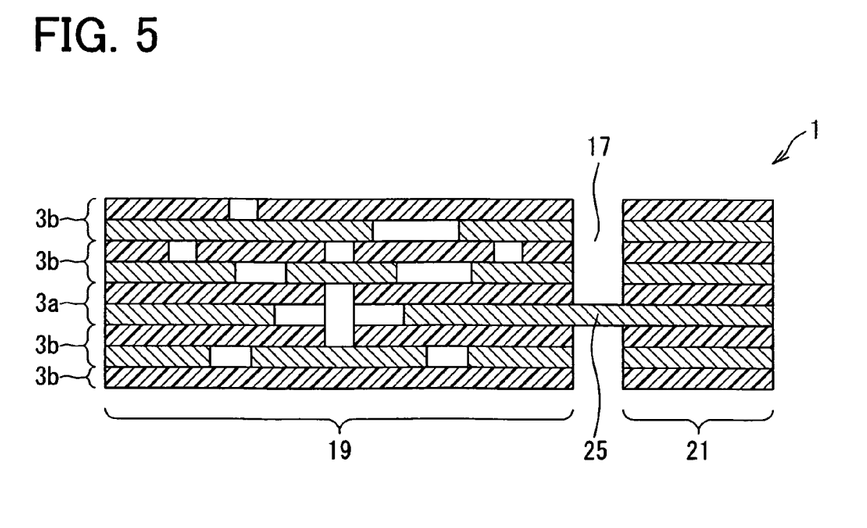
FIG. 5 is a partial cross sectional diagram taken along line V-V in FIG. 6 and illustrating a printed circuit board.

A method for manufacturing a printed circuit board 1 is described below. As shown in FIG. 5, the multiple single-sided conductor pattern films 3 are laminated. One of the multiple laminated single-sided conductor pattern films 3 is the single-sided conductor pattern film 3a, in which the GND pattern 25 extends from the center portion 19 to the end portion of the periphery portion 21. The others of the multiple laminated single-sided conductor pattern films 3 are the single-sided conductor pattern films 3b, in each which both of the resin film 5 and the conductor pattern 7 are cut at the portion corresponding to the slit 17.

Then, while a heat is being applied, pressures are applied to both of an upper surface and a lower surface of the laminated layers by using a heat press plate of vacuum heat press machine. In the present embodiment, a pressure between 1 MPa and 10 Mpa is applied while the laminated layers are being heated to temperatures between 250 degrees C. and 350 degrees C. Through the above manners, the single-sided conductor pattern film 3a and the single-sided conductor pattern films 3b are bonded with each other. The resin films 5 of the single-sided conductor pattern film 3a and the single-sided conductor pattern films 3b are thermally fusion-bonded with each other and integrated with each other. Further, due to the application of the heat and the pressure, the conductive pastes 15 in the via holes 11 are sintered and become an integrated conductive composition. There is provided a printed circuit board 1 in which adjacent conductor patters 7 are interlayer-connected.

Figure 6:
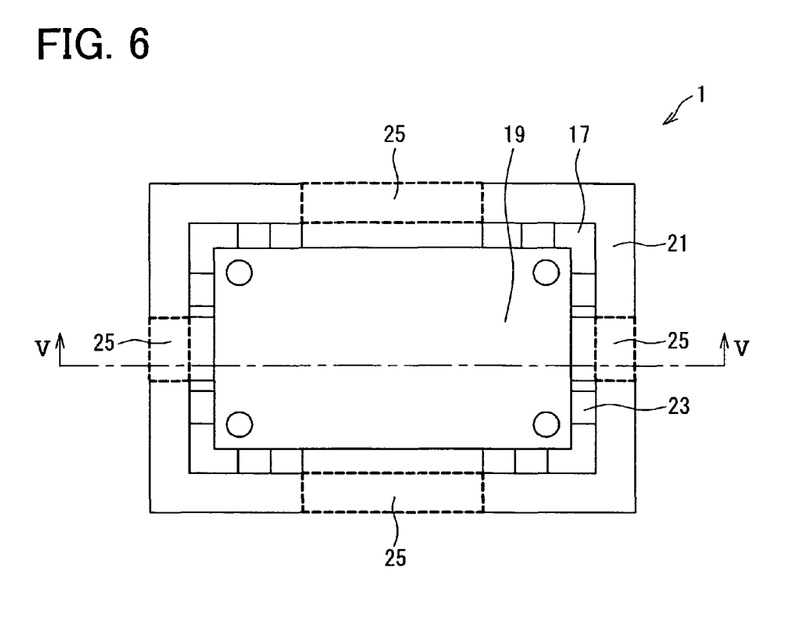
FIG. 6 is a plan view illustrating the printed circuit board.

In the manufactured printed circuit board 1, the slit 17 extending between the front surface and the rear surface is formed, as shown in FIG. 5 and FIG. 6. The GND pattern 25 of the single-sided conductor pattern film 3a extends from the center portion 19 to the end portion of the periphery portion 21 via the slit 17. FIG. 5 is a partial sectional diagram illustrating a right half of a cross section taken along line V-V in FIG. 6.

A mechanism of interlayer connection between the conductor patterns 7 is described below. The conductive paste 15 filling in the via hole 11 is in a state where the tin particles and the silver particles are mixed together. When the conductive paste 15 is heated to the temperature between 250 degrees C. and the 350 degrees C., the tin particles are attached to the silver particles so as to cover outer surfaces of the silver particles since the melting point of the tin particles is about 232 degrees C. and since the melting particles of the silver particles is about 961 degrees C. When the heating is further maintained, the molten tin diffuses from the surface of the silver particles. Tin-silver alloy having a meting point of about 480 degrees C. is formed. In the above case, since the pressure between 1 MPa and 10 Mpa is applied to the conductive paste 15, the conductive composition is formed in accordance with the formation of the tin-silver alloy. The conductive composition are made of the alloy integrated due to sintering In forming the conductive composition in the via hole 11, since the pressure is applied to the conductive composition, the conductive composition is pressure-contacted with the conductor pattern 7. Through the above processes, a solid-phase diffusion occurs between tin component of the conductive composition and a copper component of a copper foil of the conductor pattern 7. As a result, a solid-phase diffusion layer is formed at an interface between the conductive composition and the conductor pattern 7, an electrical connection is established.

Figure 7:
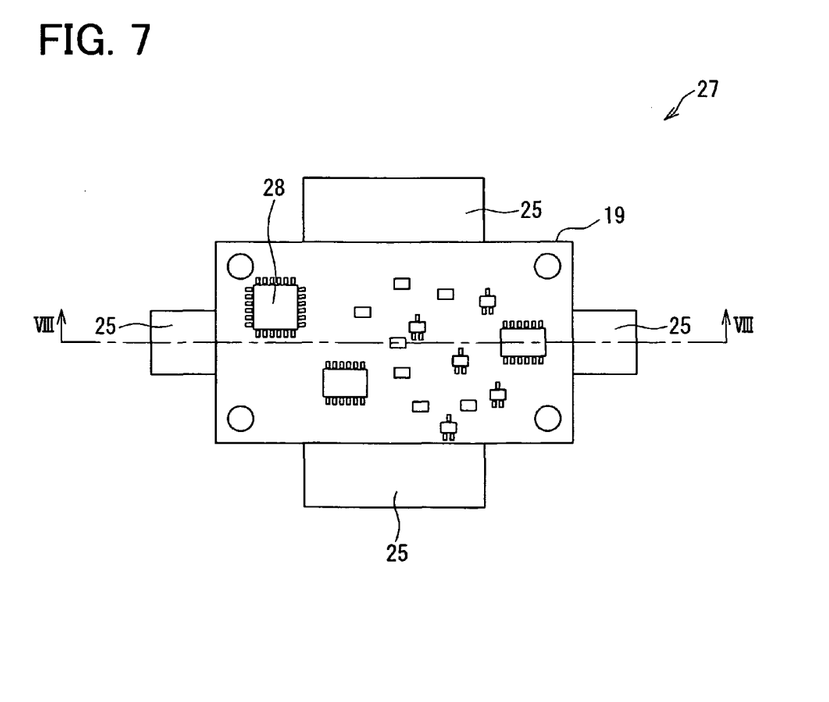
FIG. 7 is a plan view illustrating a rigid flexible printed circuit board.
Figure 8:
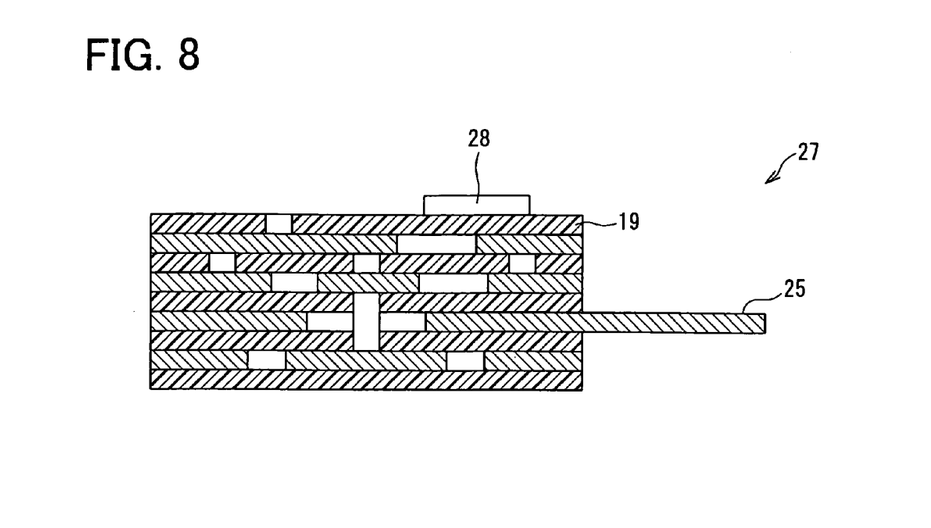
FIG. 8 is a partial cross sectional diagram taken along VIII-VIII in FIG. 7 and illustrating the rigid flexible printed circuit board.

A method for manufacturing a rigid flexible printed circuit board is described below. At first, a drill router is inserted into the slit 17 of the printed circuit board 1 and the perforation portion 23 is cut (cf. FIG. 6). In the above process, the GND pattern 25, which extends via the slit 17, remains without being cut. The GND pattern 25, which extends via the slit 17, is drawn out from the periphery portion 21, and the periphery portion 21 is removed. As a result, as shown in FIG. 7 and FIG. 8, there is provided the rigid flexible printed circuit board 27 in which the GND pattern 25 projects an outside of the center portion 19. FIG. 8 is a partial cross sectional illustrating a right half of a cross section taken along line VIII-VIII in FIG. 7. An element 28 is mounted on a surface of the rigid flexible printed circuit board 27.

Figure 9:
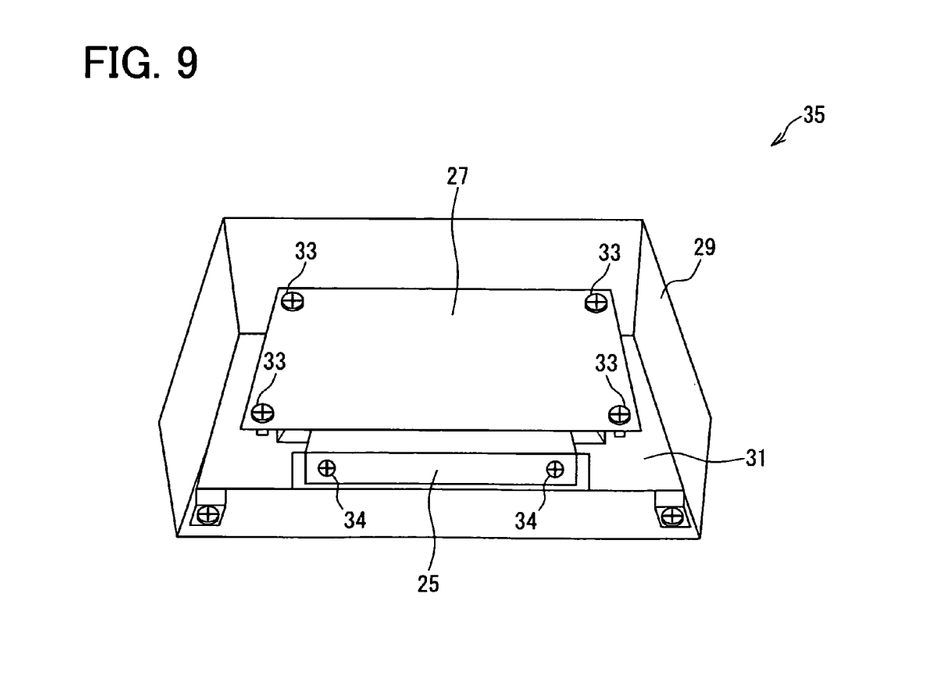
FIG. 9 is a diagram illustrating an electronic apparatus.
Figure 10:
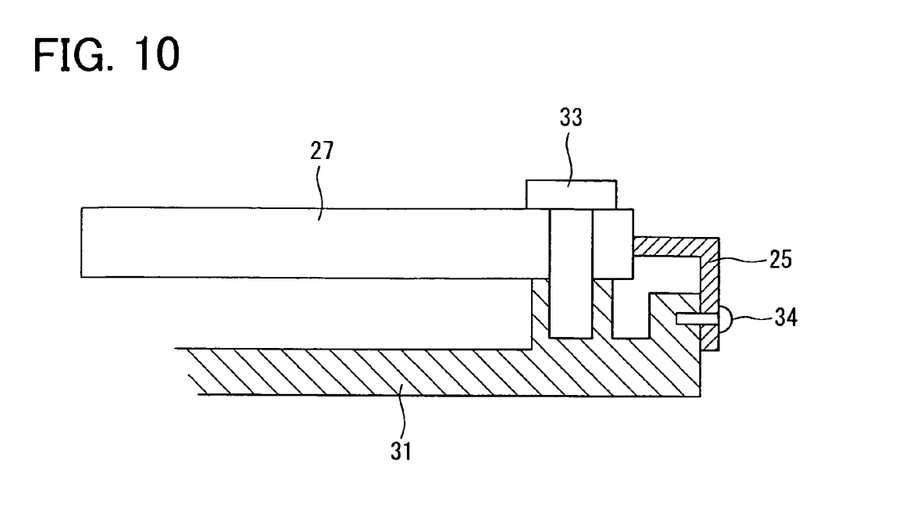
FIG. 10 is a cross sectional diagram illustrating a connection part between a rigid flexible printed circuit board and a metal frame.

A method for manufacturing an electronic apparatus is described below. As shown in FIG. 9, the rigid flexible printed circuit board 27 is accommodated in an external case 29. The external case 29 has a metal frame 31 located at a bottom of the external case 29. As shown in FIG. 9, the rigid flexible printed circuit board 27 is fixed to the metal frame 31 by using a bolt 33. As shown in FIG. 9 and FIG. 10, a portion of the GND pattern 25 of the rigid flexible printed circuit board 27 is bent roughly in a center of the portion. A part that is bent in a lower direction is connected to the metal frame 31. The GND pattern 25 and the metal frame 31 are fixed to each other by using a screw 34, and an electrical connection is established. Through the above processes, an electronic apparatus 35 receiving the rigid flexible printed circuit board 27 is manufactured.

Effects or advantages of the rigid flexible printed circuit board and the electronic apparatus are described below.

Since the rigid flexible printed circuit board 27 has the GND pattern 25 that extends outward, it is possible provide a sufficient GND area by only connecting between the GND pattern 25 and the metal frame 31 of the electronic apparatus 35. For enhancement of a GND, it becomes not necessary to add a screw hole and a spring in the rigid flexible printed circuit board 27. A manufacturing cost and a size of the rigid flexible printed circuit board 27 do not increase.

The GND pattern 25 is formed through the periphery portion 21 which finally becomes unnecessary. Therefore, in forming the above GND pattern 25, the number of parts of the rigid flexible printed circuit board 27 does not change. A manufacturing cost of the rigid flexible printed circuit board 27 does not increase.

By using the printed circuit board 1, it is possible to easily manufacture the rigid flexible printed circuit board 27 by cutting the perforation portion 23.

Figure 11:
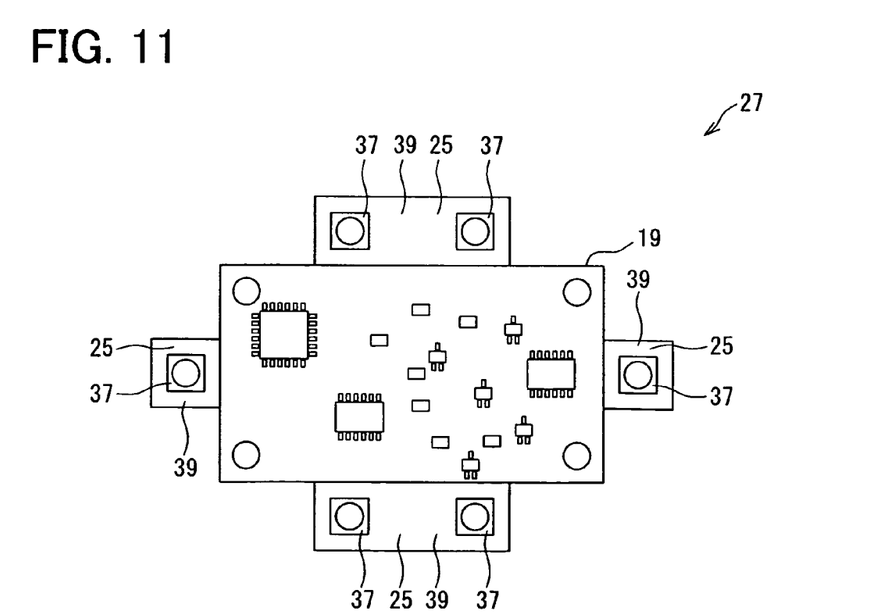
FIG. 11 is a cross sectional diagram illustrating a rigid flexible printed circuit board.
Figure 12:
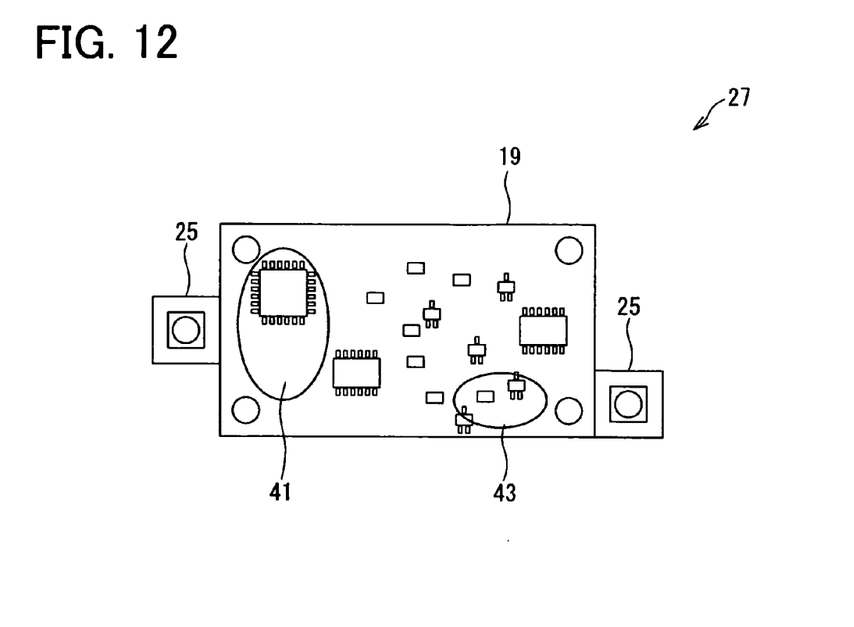
FIG. 12 is a cross sectional diagram illustrating a rigid flexible printed circuit board.
Figure 13:
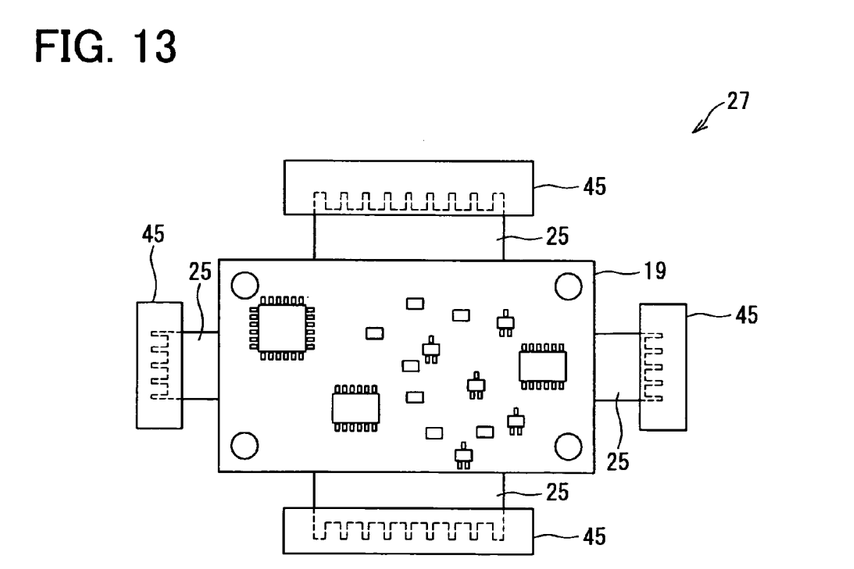
FIG. 13 is a cross sectional diagram illustrating a rigid flexible printed circuit board.

The above embodiments can be modified in various ways. For example, as shown in FIG. 11, a resist 39 may cover the GND pattern 25 except a periphery 37 of a screw hole for insertion of a screw 34. The periphery 37 is a portion adapted to contact the metal frame 31. Alternatively, the GND pattern 25 may not be located at four places. The GND pattern 25 may be located only close to a place where enhancement of a GND is required. For example, as shown in FIG. 12, the GND pattern 25 may be located close to a noise source 41 or a portion 43. In the portion 43, arrangement of elements or patterns prevents a ground pattern to be large. Alternatively, as shown in FIG. 13, the GND pattern 25 may be attached to the metal frame by using a conductive tape 45. In such a case, when an end portion of the GND pattern 25 has serrations as shown in FIG. 13, it is possible to increase a contact area between the conductive tape 45 and the metal frame 31. It is hence possible to enhance reliability of the contact. Alternatively, the GND pattern may be in contact with the external case 29. The rigid flexible printed circuit board 27 may be a multilayer rigid flexible printed circuit board.

While the invention has been described above with reference to various embodiments thereof, it is to be understood that the invention is not limited to the above described embodiments and construction. The invention is intended to cover various modification and equivalent arrangements. In addition, while the various combinations and configurations described above are contemplated as embodying the invention, other combinations and configurations, including more, less or only a single element, are also contemplated as being within the scope of embodiment.

What is claimed is:

1. A printed circuit board having an insulation layer and a conductor layer, the printed circuit board comprising:
   a center portion having an element mounting area;
   a periphery portion surrounding the center portion;
   a slit pattern partitioning the periphery portion and the center portion; and
   a GND pattern located in the conductor layer, the GND pattern extending through the center portion and the periphery portion,
   wherein:
   the center portion extends through the insulation layer and the conductor layer in a thickness direction of the insulation layer and the conductor layer;
   the periphery portion extends through the insulation layer and the conductor layer in the thickness direction of the insulation layer and the conductor layer;
   the slit pattern including a slit portion and a connected portion;
   the slit portion extends through the insulation layer and partially extends through the conductor layer in the thickness direction of the insulation layer and the conductor layer; and
   the connected portion connects the center portion and the periphery portion.

* * * * *